(12) United States Patent
Gopal et al.

(10) Patent No.: US 8,312,363 B2
(45) Date of Patent: Nov. 13, 2012

(54) RESIDUE GENERATION

(75) Inventors: Vinodh Gopal, Westborough, MA (US); Erdinc Ozturk, Worcester, MA (US); Gilbert Wolrich, Framingham, MA (US); Wajdi Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 1001 days.

(21) Appl. No.: 12/336,029

(22) Filed: Dec. 16, 2008

(65) Prior Publication Data

US 2010/0153829 A1      Jun. 17, 2010

(51) Int. Cl.
*G06F 11/00* (2006.01)
(52) U.S. Cl. ......... 714/808; 714/807; 708/531; 708/532
(58) Field of Classification Search .................. None
See application file for complete search history.

(56) References Cited

U.S. PATENT DOCUMENTS

| | | | | |
|---|---|---|---|---|
| 2007/0297601 | A1* | 12/2007 | Hasenplaugh et al. | 380/28 |
| 2009/0019342 | A1* | 1/2009 | Gueron et al. | 714/781 |
| 2009/0157784 | A1* | 6/2009 | Gopal et al. | 708/400 |
| 2009/0158132 | A1* | 6/2009 | Gopal et al. | 714/808 |

OTHER PUBLICATIONS (Hasenplaugh, W. et al., "Fast Modular Reduction", Proceedings of the 18th I EEE Symposium on Computer Arithmetic, Jun. 25-27, 2007, pp. 225-229).*

Hasenplaugh, W. et al., "Fast Modular Reduction", Proceedings of the 18th IEEE Symposium on Computer Arithmetic, Jun. 25-27, 2007, pp. 225-229.

Kounavis, M. E., et al., "Novel Table Lookup-Based Algorithms for High-Performance CRC Generation", IEEE Transactions on Computers, vol. 57, No. 11, (Nov. 2008),1550-1560 pgs.

U.S. Appl. No. 11/959,142, "U.S. Appl. No. 11/959,142 titled "Determining a Message Residue" filed Dec. 18, 2007".

U.S. Appl. No. 12/291,621, "U.S. Appl. No. 12/291,621 titled "Determining a Message Residue" filed Nov. 12, 2008".

* cited by examiner

*Primary Examiner* — Scott Baderman
*Assistant Examiner* — Jason Bryan
(74) *Attorney, Agent, or Firm* — Christopher K. Gagne

(57) ABSTRACT

In one embodiment, circuitry is provided to generate a residue based at least in part upon operations and a data stream generated based at least in part upon a packet. The operations may include at least one iteration of at least one reduction operation including (a) multiplying a first value with at least one portion of the data stream, and (b) producing a reduction by adding at least one other portion of the data stream to a result of the multiplying. The operations may include at least one other reduction operation including (c) producing another result by multiplying with a second value at least one portion of another stream based at least in part upon the reduction, (d) producing a third value by adding at least one other portion of the another stream to the another result, and (e) producing the residue by performing a Barrett reduction based at least in part upon the third value.

17 Claims, 5 Drawing Sheets

RESIDUE GENERATION

FIELD

This disclosure relates to residue generation.

BACKGROUND

In one conventional arrangement, a frame is transmitted from a first device to a second device. Prior to transmitting the frame, the first device inserts into the frame a Cyclic Redundancy Check (CRC) value calculated from a portion of the frame. After the second device receives the frame, the second device re-generates the CRC value from that same portion of the frame (as received by the second device), and compares this re-generated CRC value to the CRC value inserted in the frame by the first device to determine whether error is present in the portion of the frame (as received by the second device).

In this conventional arrangement, CRC computation is based on interpreting a stream of bits as coefficients of a polynomial. For example, in this conventional arrangement, the stream "1010" corresponds to a polynomial of $(1x^3)+(0x^2)+(1x^1)+(0\ x^0)$ or, more simply, $x^3+x^1$. This polynomial is divided by another polynomial known as the modulus. By way of simplistic example, the other polynomial may be "11" or $x+1$. The CRC value is calculated as the remainder of a division of the bit stream polynomial by the modulus. CRC polynomial division, however, is somewhat different from ordinary division in that it is done according to the carry-less mathematics of the finite field $GF(2)$, in which, e.g., even number coefficients become zeroes and odd number coefficients become ones. As can be readily appreciated, the computations involved in determining CRC values increases processing overhead in this conventional arrangement.

BRIEF DESCRIPTION OF THE SEVERAL VIEWS OF THE DRAWINGS

Features and advantages of embodiments will become apparent as the following Detailed Description proceeds, and upon reference to the Drawings, wherein like numerals depict like parts, and in which.

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
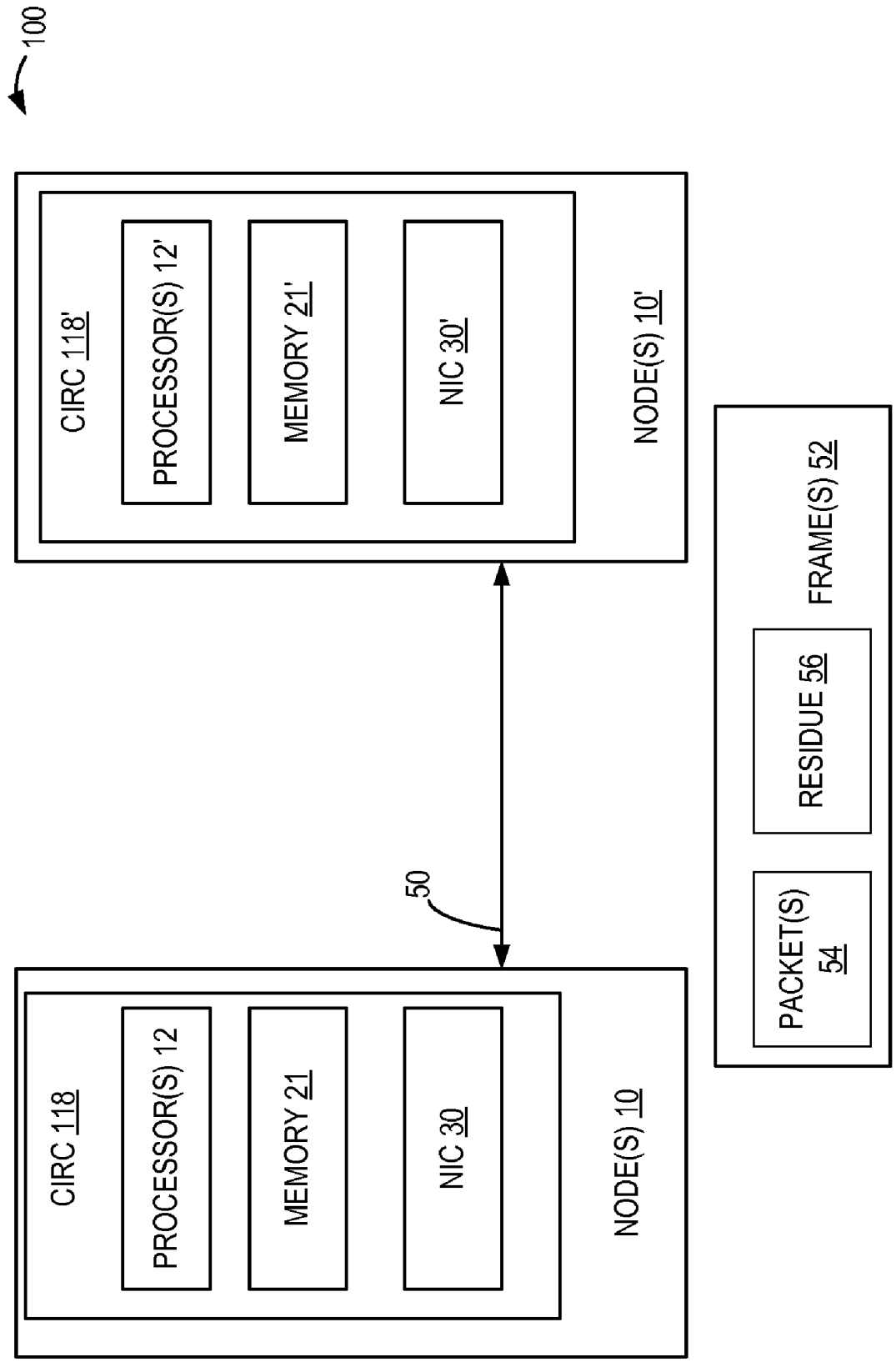
FIG. 1 illustrates a system embodiment.

FIG. 1 illustrates a system embodiment 100. System 100 may include one or more network nodes 10 that may be communicatively coupled via one or more wireless and/or wired communication links 50 to one or more other network nodes 10'. In this embodiment, a "network node" or "node" may be used interchangeably to mean an entity communicatively coupled in and/or to a network, such as, for example, an end station, appliance, intermediate station, network interface, client, server, and/or portion thereof. In this embodiment, a "network" may be or comprise two or more nodes that are communicatively coupled together. Also in this embodiment, a node may be "communicatively coupled" to another node if the one node is capable of transmitting to and/or receiving from the other node one or more packets. As used herein, a "wireless communication link" means any modality, and/or portion thereof, that permits, at least in part, at least two nodes to be wirelessly communicatively coupled, at least in part. Also as used herein, a "wired communication link" means any modality and/or portion thereof, that permits, at least in part, at least two nodes to be communicatively coupled, at least in part, via non-wireless means, at least in part. As used herein, a "packet" may comprise one or more symbols and/or values; also, in this embodiment, a "frame" may likewise comprise one or more symbols, values, and/or one or more packets.

In this embodiment, as shown in FIG. 1, one or more nodes 10 may comprise operative circuitry 118. Circuitry 118 may comprise one or more host processors 12, computer-readable/writable memory 21, and network interface controller 30. As used herein, "circuitry" may comprise, for example, singly or in any combination, analog circuitry, digital circuitry, hard-wired circuitry, programmable circuitry, state machine circuitry, and/or memory that may comprise program instructions that may be executed by programmable circuitry. Each of the host processors 12 may be coupled to computer-readable/writable memory 21 via a not shown memory hub system. Each of the one or more host processors 12 may comprise, for example, a respective Intel® microprocessor (and/or chipset) that is commercially available from the Assignee of the subject application. As used herein, a "processor" means circuitry capable of performing, at least in part, one or more arithmetic and/or logical operations. Of course, alternatively, each of the host processors 12 may comprise, for example, a respective microprocessor (and/or chipset) that is manufactured and/or commercially available from a source other than the Assignee of the subject application, without departing from this embodiment. One or more nodes 10 also may comprise a not shown user interface system may comprise, e.g., a keyboard, pointing device, and display system that may permit a human user to input commands to, and monitor the operation of, system 100. Network interface controller (NIC) 30 may permit one or more nodes 10 to be communicatively coupled via one or more communication links 50 to one or more nodes 10'.

One or more machine-readable program instructions may be stored in computer-readable/writable memory 21. In operation of one or more nodes 10, these instructions may be accessed and executed by one or more host processors 12 and/or NIC 30. When executed by one or more host processors 12 and/or NIC 30, these one or more instructions may result in operative circuitry 118, host processor 12, and/or NIC 30 performing the operations described herein as being performed by operative circuitry 118, host processor 12, and/or NIC 30. Computer-readable/writable memory 21 may comprise one or more of the following types of memories: semiconductor firmware memory, programmable memory, non-volatile memory, read only memory, electrically programmable memory, random access memory, flash memory, magnetic disk memory, optical disk memory, and/or other or later-developed computer-readable and/or writable memory.

One or more nodes 10' may comprise respective operative circuitry 118' whose construction and operation may conform, in whole or in part, to the construction and operation of circuitry 118'. Thus, circuitry 118' may comprise one or more host processors 12', memory 21', and NIC 30' whose respective construction and operation may conform, in whole or in part, to the respective construction and operation of one or more host processors 12', memory 21', and NIC 30', respectively. NIC 30' may permit one or more nodes 10' to be communicatively coupled to one or more nodes 10 via one or more links 50.

One or more machine-readable program instructions may be stored in computer-readable/writable memory 21' that may be comprised in circuitry 118'. In operation of one or more nodes 10', these instructions may be accessed and executed by the one or more host processors 12' and/or NIC 30' that may be comprised in circuitry 118'. When executed by one or more host processors 12' and/or NIC 30', these one or more instructions may result in operative circuitry 118', one or more host processors 12', and/or NIC 30' performing the operations described herein as being performed by operative circuitry 118', one or more host processors 12', and/or NIC 30'.

One or more communication links 50 may be compatible with one or more communication protocols. For example, in this embodiment, one or more links 50 may be compatible with, e.g., Ethernet protocol and/or Transmission Control Protocol/Internet Protocol (TCP/IP) protocol. Additionally or alternatively, one or more links 50 may be compatible with, e.g., one or more wireless communication protocols.

The Ethernet protocol that may be used in system 100 may comply or be compatible with the protocol described in Institute of Electrical and Electronics Engineers, Inc. (IEEE) Std. 802.3, 2000 Edition, published on Oct. 20, 2000. Alternatively or additionally, the TCP/IP protocol that may be used in system 100 may comply or be compatible with the protocols described in Internet Engineering Task Force (IETF) Request For Comments (RFC) 791 and 793, published September 1981. Additionally or alternatively, the one or more wireless communication protocols that may be used in system 100 may comply or be compatible with IEEE 802.11-1999: Wireless LAN Medium Access Control (MAC) and Physical Layer (PHY) Specifications, IEEE Working Group (1999-07-15), published 1999, IEEE, Inc., and/or other and/or later-developed wireless protocols. Of course, many different communication protocols may be used for such data and/or command exchange without departing from this embodiment.

With reference being made to FIGS. 1-5, operations 500 that may be performed in system 100 according to an embodiment will now be described. After, for example, a reset of one or more nodes 10, 10', and/or of system 100, circuitry 118 may generate and issue, at least in part, to circuitry 118' one or more frames 52. One or more frames 52 may comprise one or more packets 54 and residue 56. Residue 56 may be or comprise CRC value 326 (see FIG. 3). In this embodiment, bits of one or more packets 54 may be treated as the coefficients of a polynomial S. For purposes of this embodiment, CRC value 326 and/or residue 56 may be equal to:

$$S \cdot 2^{32} \bmod P,$$

where P may be a CRC generator polynomial value 320. As will be appreciated, the size and value of P may vary depending upon, e.g., the application without departing from this embodiment.

Figure 2:
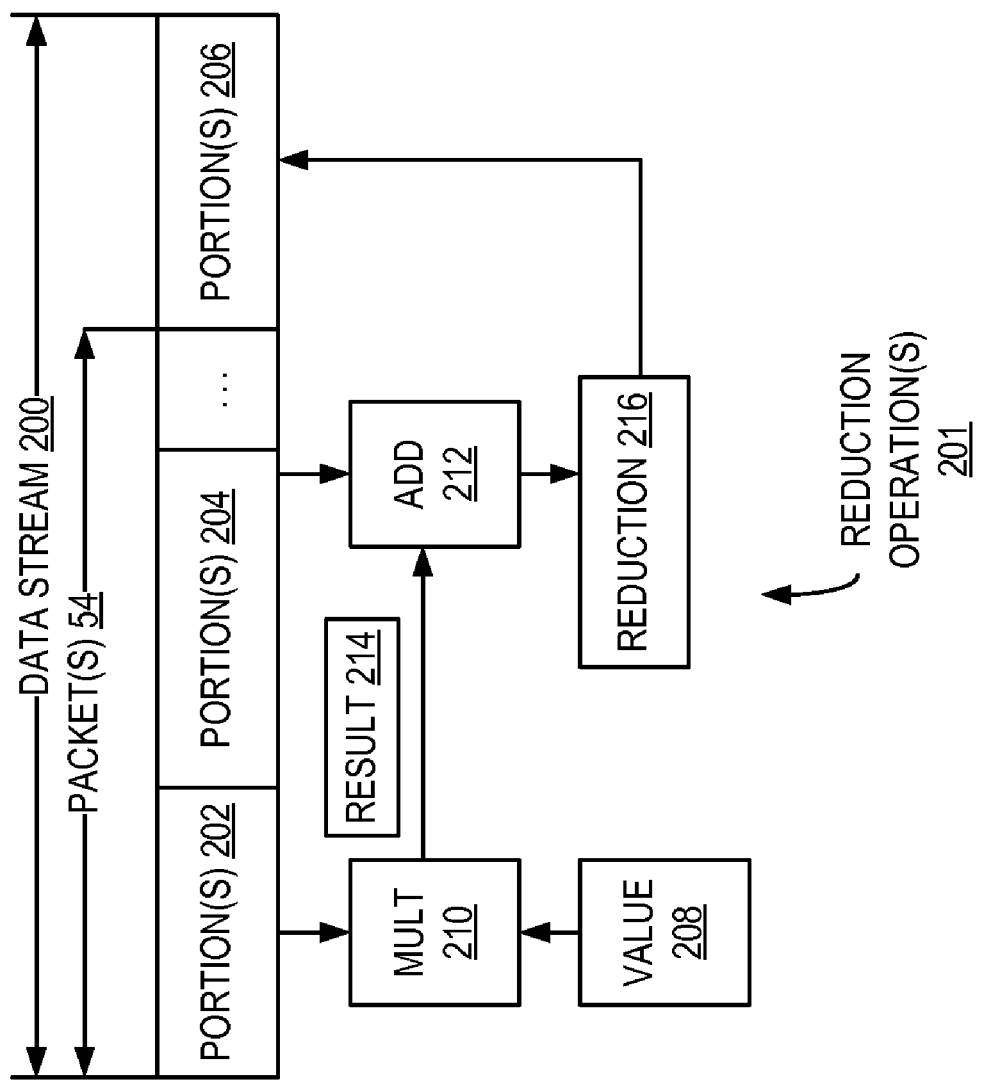
FIG. 2 illustrates one or more iterations of one or more reduction operations in an embodiment.
Figure 3:
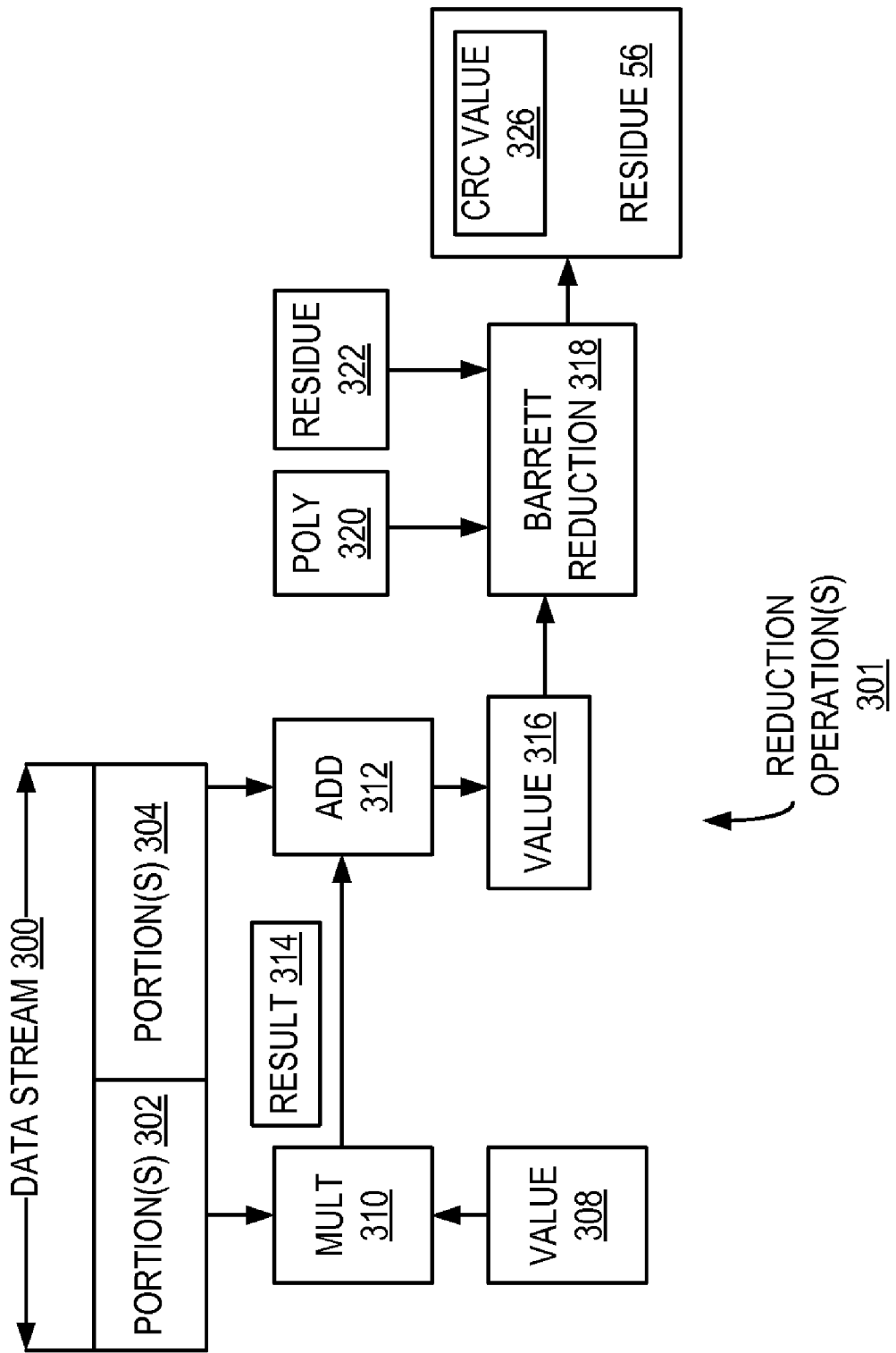
FIG. 3 illustrates one or more other reduction operations in an embodiment.

Prior to generating and issuing one or more frames 52, one or more processors 12 and/or NIC 30 may generate residue 56 based at least in part upon certain operations 500 and a data stream 200 generated based at least in part upon the one or more packets 54 (see FIG. 2). These certain operations 500 may comprise executing at least one iteration of at least one reduction operation 502 and executing at least one other reduction operation 504. Depending at least in part upon the size (e.g., number of bits) of one or more packets 54, data stream 200 may comprise both the one or more packets 54 and one or more additional portions of data 206, or alternatively, data stream 200 may only comprise one or more packets 54. That is, if the size of one or more packets 54 exceeds the maximum data stream size that a single iteration of one or more reduction operations 201 may be capable of reducing for input and use by one or more reduction operations 301, then a plurality of iterations of reduction operation 201 may be utilized until the size of data stream 200 reaches the maximum size that a single iteration of one or more reduction operations 201 may be capable of reducing for input and use by one or more reduction operations 301; in this plurality of iterations of one or more reduction operations 201, prior to commencement of a respective succeeding iteration, the respective reduction 216 generated as a result of the last preceding respective iteration may be appended at the end of the data stream 200 (as indicated by one or more portions 206 of data stream 200 in FIG. 2), and the resulting data stream 200 may be shifted in the direction of one or more portions 202 and used in the respective succeeding iteration. Conversely, however, if the size of packet 54 is at most equal to this maximum size, then the data stream 200 may only comprise packet 54 and a single iteration of reduction operation 201 may be utilized.

For example, in this embodiment, in the initial iteration of reduction operation 201, one or more high order portions 202 (which in this embodiment may correspond to the highest order 64 bits of packet 54) of data stream 200 may be multiplied (as illustrated by multiplication operation 210) a predetermined constant value 208 (which in this embodiment may have a size of 32 bits, and whose calculation will be described later with reference to FIG. 4), and the result 214 may be added (as illustrated by addition operation 212) to one or more next most relatively high order portions 204 (which in this embodiment may correspond to the next highest order 96 bits of packet 54) of data stream 200 to produce, as an output of this iteration of operation 201, reduction 216 (which in this embodiment may have a size of 96 bits). In carrying out the multiplication and addition operations 210, 212, respectively, the rules of finite field GF(2) mathematics are employed, e.g., carry-out bits are dropped from the result 214 and reduction 216, respectively. Thus, in this iteration of operation 201, 160 high order bits (i.e., portions 202 and 204) of stream 200 are reduced to a 96 bit reduction 216. In this embodiment, if the size of packet 54 is at most equal to 160 bits, then only a single iteration of operation 201 may be utilized, and reduction 216 may be input, as data stream 300, to reduction operation 301 shown in FIG. 3.

Conversely, if the size of packet 54 exceeds 160 bits, then a plurality of iterations of reduction operation 201 may be utilized until the size of data stream 200 becomes at most 160 bits; in this plurality of iterations of one or more reduction operations 201, prior to commencement of a respective succeeding iteration, the respective reduction 216 generated as a result of the last preceding respective iteration may be appended at the end of the data stream 200 (as indicated by one or more portions 206 of data stream 200 in FIG. 2), and the next highest order bits comprised in one or more packets 54 and/or portions 206 in data stream 200 may be shifted into portions 202 and 204 for use in the next iteration of one or more reduction operations 201 in the manner described previously. These iterations of one or more reduction operations 201 may continue until the data stream 200 has a size that is at most 160 bits in length, at which point a final iteration of one or more operations 201 may be carried out, and the resulting reduction 216 may be input, as data stream 300, to one or more reduction operations 301 illustrated in FIG. 3.

Data stream 300 may be segmented, for purposes of one or more reduction operations 301, into at least one highest order portion 302 and at least one relatively lower order portion 304. That is, in this embodiment, at least one portion 302 may comprise one or more highest order portions of the reduction 216 that was input, as data stream 300, to one or more reduction operations 301, and at least one portion 302 may comprise the remaining relatively lower order portions of that reduction 216. For example, in this embodiment, at least one portion 302 may comprise the highest 32 bits of this reduction 216, and at least one portion 304 may comprise the next lower 64 bits of this reduction 216. As part of one or more reduction operations 301, at least one portion 302 may be multiplied (as illustrated by multiplication operation 310) by a predetermined constant value 308 (which in this embodiment may comprise 32 bits and may be computed in the manner that will be described with reference to FIG. 4). The result of multiplication operation 310 may be added (as illustrated by addition operation 312) to at least one portion 304. The value 316 that results from addition operation 312 may undergo a Barrett reduction operation 318 based at least in part upon two additional values: CRC generator polynomial value 320 (which in this embodiment may have a size of 32 bits) and a residue 322 (whose calculation will be described below). In this embodiment, the Barrett reduction operation may be in accordance with, for example, the techniques disclosed in, among other places, the section entitled "6. Modification to Barrett's Method," of the article, Hasenplaugh et al., "Fast Modular Reduction," *Proceedings of the 18th IEEE Symposium on Computer Arithmetic*, Jun. 25-27, 2007, pp. 225-229 (hereinafter "the Hasenplaugh article"). In implementing these techniques in the context of Barrett reduction operation 318, the generator polynomial 320 may be the "modulus" described in the Hasenplaugh article, and the residue 322 may be the "μ" value described in the Hasenplaugh article. In carrying out the operations 310, 312, and 318, the rules of finite field GF(2) mathematics may be employed. Of course, without departing from this embodiment, other reduction algorithms may be used.

Figure 4:
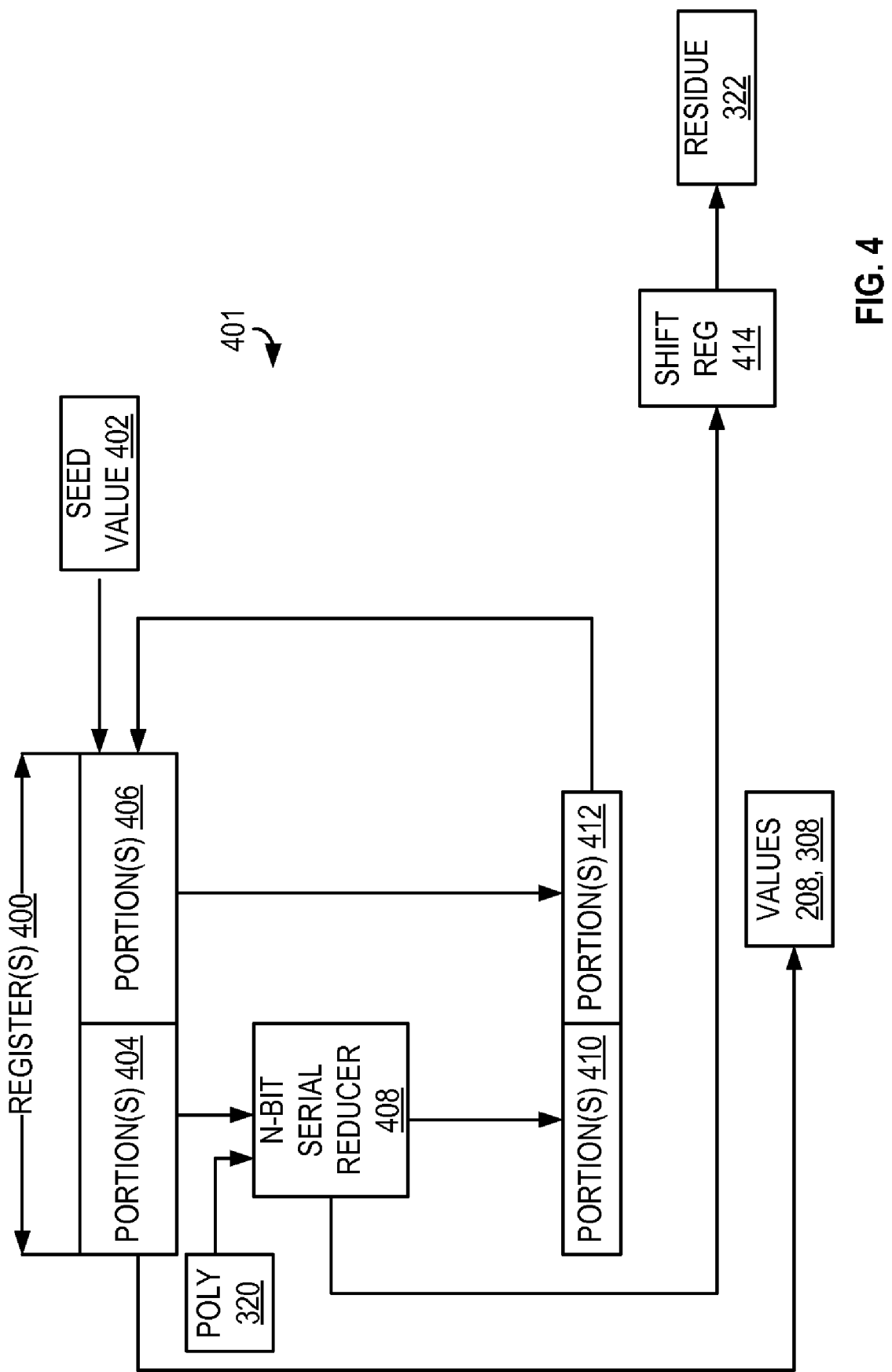
FIG. 4 illustrates production of a residue utilized in the one or more other reduction operations illustrated in FIG. 3.
Figure 5:
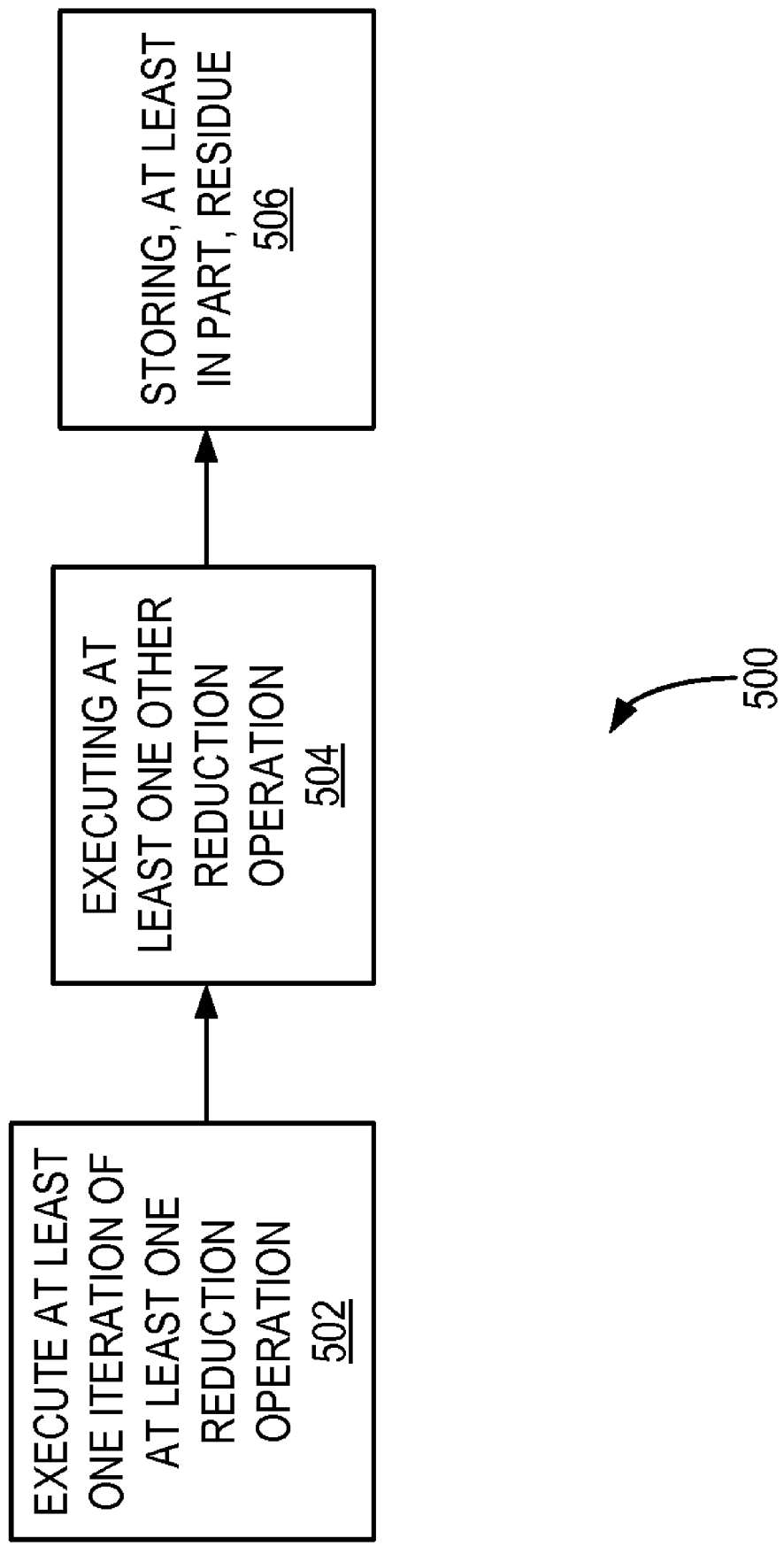
FIG. 5 is a flowchart illustrating operations in an embodiment.

FIG. 4 illustrates one or more operations 401 in an embodiment that may be used to calculate values 208 and 308, and residue 322. In this embodiment, in order to permit operations 201 and 301 to generate residue 56 and/or CRC value 326 in such a way that residue 56 and/or CRC value 326 may be used to detect (and/or correct) error in transmission of one or more frames 52 and/or one or more packets 54, values 208 and 308, and residue 322 may be pre-calculated (e.g., prior to their being used in operations 201 or 301, as the case may be) and may be equal to $x^{96}$ mod p, $x^{64}$ mod P, and the "μ" value described in the Hasenplaugh article, where $x^y$ denotes the first $y^{th}$ high order bits of the data stream 200, and P denotes the generator polynomial 320.

In this embodiment, one or more operations 401 may commence with one or more registers (e.g., comprised in memory 21) 400 storing an initial seed value 402. The one or more registers 400 and/or the seed value 402 may each be 96-bits in size. The initial seed value 402 may be equal to $x^{96}$. After being stored in one or more registers 400, one or more highest order portions 404 (which in this embodiment may be the 36 highest order bits) of the seed value 402 may undergo an initial N-bit (in this embodiment, 4-bit) serial reduction (illustrated in FIG. 4 by reducer operation 408) based at least in part upon polynomial 320. More specifically, in this embodiment, reducer operation 408 may divide the one or more portions 404 by the polynomial value 320 to produce an N-bit (in this embodiment 4-bit) quotient which may be output to one or more shift registers 414, and an M-bit (in this embodiment 32-bit) remainder (illustrated in FIG. 4 as one or more high order portions 410). One or more high order portions 410 may be concatenated with one or more low order portions 412 (which in this embodiment, may constitute the one or more lower order portions 406 of the seed value 404 stored in one or more registers 400, and have a size of 60 bits). The resultant concatenation may then have an appropriate number of low order bits (set equal to zero) appended thereto to permit the resultant value to have a size of 96 bits, and the resultant value may be stored in one or more registers 400, overwriting the seed value 402 previously stored therein.

One or more operations 401 may be repeated a first predetermined number of iterations (in this embodiment 32 iterations, including the initial iteration). It can be shown mathematically that after one or more operations 401 have been performed 32 times, the value stored in one or more registers 400 may be equal to $(x^{64}$ mod $P)*x^{32}$. Thus, at this point, the highest order 32 bits of this value may be extracted from one or more registers 400 and stored in memory 21 as value 308 for use in one or more operations 301. Thereafter, one or more operations 401 may be repeated for another predetermined number of iterations (in this embodiment, another 32 iterations). It can be shown mathematically that after a total of 64 iterations of one or more operations 401 have been performed, the highest order 32 bits of the value stored in one or more registers 400 may be equal to $x^{96}$ mod P, and therefore, may be extracted and stored in memory 21 as value 208 for use in one or more operations 201.

During each iteration of one or more operations 401, each of the 4-bit quotients output from reducer 408 may stored in one or more shift registers 414. One or more shift registers 414 may store these quotients (with an appropriate shift operation being performed during each iteration of one or more operations 401), for a predetermined number of iterations of one or more operations 401, until the size and characteristics of the value stored in one or more registers 414 enable this value to serve as an appropriate "μ" value, as described in the Hasenplaugh article, given the other parameters of system 100. When this is achieved, the value stored in one or more shift registers 414 may be stored in memory 21 and used as residue 322 in one or more operations 301.

As stated previously, during each iteration of one or more operations 401, reducer 408 divides one or more portions 404 by polynomial value 320, outputs the quotient of this division to one or more shift registers 414, and outputs the remainder of this division as one or more portions 410. This division may be implemented, for example, using serial division hardware (not shown) that may comprise 5 stages (not shown) in which in the first stage the highest order bit of the initially input value (i.e., one or more portions 404) is output as the highest order bit of the 4-bit quotient and also undergoes a logical AND operation with polynomial value 320. The output of this AND operation is then added (using carry-less mathematically techniques) to the next highest 35 bits of the initially input value to generate a 35 bit value which is input to the next stage. The next stage of the hardware outputs the highest order bit of this 35 bit input value as the next highest order bit of the 4-bit quotient, and also undergoes a logical AND operation with polynomial value 320. The output of this AND operation is then added (using carry-less mathematical techniques) to the next highest 34 bits of the input 35 bit value to generate a 34 bit value which is input to the next stage. The techniques implemented by the first two stages of the hardware continue in the remaining 3 stages of the hardware until the 4-bit quotient and 32 bit remainder are generated. Of course, many other and/or additional division techniques may be used without departing from this embodiment.

The result of the Barrett reduction 318 may be residue 56, which as stated previously, in this embodiment, may be or comprise CRC value 326. After calculating residue 56, circuitry 118, one or more processors 12, and/or NIC 30 may store residue 56 in memory 21, as illustrated by operation 506 in FIG. 5. Residue 56 may be transmitted by node 10 to node 10' as part of one or more frames 52. After NIC 30' receives one or more frames 52, one or more processors 12', circuitry 118', and/or NIC 30' may use the techniques of this embodiment to recalculate residue 56 based at least in part upon one or more packets 54, as received by NIC 30', and may compare the recalculation of residue 56 to the residue 56 that was transmitted in one or more frames 52 to determine whether error in transmission of one or more packets 54 and/or one or more frames 52 from node 10 to node 10' has occurred.

Although the CRC value 326 and/or residue 56 have been described above as comprising 32 bits in an embodiment, value 326 and/or residue 56 are not limited to a particular size. Indeed, depending upon the desired size of (and/or error detection and/or correction resolution to be afforded by) the residue 56 and/or CRC value 326, the size of residue 56 and/or value 326 may vary without departing from this embodiment. Similarly, the techniques described above may be utilized for portions 202, 204, 302, 304, 404, and/or 406 of arbitrary and/or non-uniform sizes. Additionally, although an embodiment has been described in connection with transmission of residue 56 and/or value 326 in one or more frames 52 from network node 10 to network node 10', residue 56 and/or value 326 may be used in connection with error detection and/or correction (and/or applications not involved with same) in other contexts and/or environments, such as, for example, transmissions and/or computations within processor 12, NIC 30, circuitry 118, and/or node 10.

Thus, in an embodiment, circuitry is provided to generate a residue based at least in part upon operations and a data stream generated based at least in part upon a packet. The operations may include at least one iteration of at least one reduction operation including (a) multiplying a first value with at least one portion of the data stream, and (b) producing a reduction by adding at least one other portion of the data stream to a result of the multiplying. The operations may include at least one other reduction operation including (c) producing another result by multiplying with a second value at least one portion of another stream based at least in part upon the reduction, (d) producing a third value by adding at least one other portion of the another stream to the another result, and (e) producing the residue by performing a Barrett reduction based at least in part upon the third value.

Advantageously, the reduction operations of this embodiment may permit the data stream based at least in part upon the packet to be reduced into one or more smaller sets of equivalent data (e.g., equivalent for purposes of CRC and/or residue calculation and/or implementation) using faster, computationally less expensive operations compared to the prior art. Additionally, in this embodiment, the generation of residue 56 and/or CRC value 326 may be (but is not required to be) implemented entirely or almost entirely in hardware, and the critical path for such hardware may comprise a single 64 bit by 32 bit multiplier (e.g., in one or more operations 201) and accumulate logic delay. These delays may be equivalent to a 32 bit multiplier and an exclusive-or gate delay, respectively. This permits this embodiment to be able to generate residue 56 and/or CRC value 326 much faster than is possible than in the prior art, especially compared to prior art that implements residue and/or CRC calculations primarily or entirely in software. Further advantageously, the total area that may be consumed by the hardware that may be used to generate residue 56 and/or value 326 in this embodiment may be approximately the same as the hardware that may be used in such software-implemented prior art. Yet further advantageously, the values 208, 308 and residue 322 may be calculated prior to carrying out operations 201 and/or 301, in a manner that is much more efficient compared to the prior art.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Indeed, without departing from this embodiment, system 100 may include more or fewer than the elements shown in the Figures and described previously herein as being comprised system 100. Accordingly, the claims are intended to cover all such equivalents.

What is claimed is:

1. Circuitry to generate a residue based at least in part upon operations and a data stream generated based at least in part upon a packet, the operations comprising:
at least one iteration of at least one reduction operation including (a) multiplying a first value with at least one portion of the data stream, and (b) producing a reduction by adding at least one other portion of the data stream to a result of the multiplying;
at least one other reduction operation including (c) producing another result by multiplying with a second value at least one portion of another stream based at least in part upon the reduction, (d) producing a third value by adding at least one other portion of the another stream to the another result, and (e) producing the residue by performing a Barrett reduction based at least in part upon the third value;
(f) dividing a high order portion of a fourth value by a cyclical check (CRC) generator polynomial to produce a respective quotient and respective remainder;
(g) repeating (f) respective predetermined numbers of times, and after the repeating (f) the respective predetermined numbers of times, selecting as the first value and the second value respective remainders generated as a result of the repeating (f) the respective predetermined numbers of times; and
storing, at least in part, the residue in memory.

2. The circuitry of claim 1, wherein:
the first value and second value are equal to respective modular divisions of respective data stream portions by the CRC generator polynomial; and
the residue comprises a CRC value corresponding to the packet.

3. The circuitry of claim 2, wherein:
the Barrett reduction is also based at least in part upon the polynomial and another residue.

4. The circuitry of claim 3, wherein the circuitry is also to:
select as the another residue a fifth value constructed based at least in part upon one or more respective quotients generated as a result of the repeating of (f).

5. The circuitry of claim 1, wherein:
the at least one iteration comprises a plurality of iterations; and
in the at least one iteration, the at least one other portion of the data stream comprises a previous reduction generated as a result of a previous iteration comprised in the plurality of iterations.

6. The circuitry of claim 1, wherein:
the circuitry is comprised in a network node; and
the packet is one of received by and to be transmitted from the network node.

7. A method to generate a residue based at least in part upon operations implemented at least in part by circuitry and a data stream generated based at least in part upon a packet, the operations comprising:
executing at least one iteration of at least one reduction operation including (a) multiplying a first value with at least one portion of the data stream, and (b) producing a reduction by adding at least one other portion of the data stream to a result of the multiplying;
executing at least one other reduction operation including (c) producing another result by multiplying with a second value at least one portion of another stream based at least in part upon the reduction, (d) producing a third value by adding at least one other portion of the another stream to the another result, and (e) producing the residue by performing a Barrett reduction based at least in part upon the third value;
(f) dividing a high order portion of a fourth value by a cyclical check (CRC) generator polynomial to produce a respective quotient and respective remainder;
(g) repeating (f) respective predetermined numbers of times, and after the repeating (f) the respective predetermined numbers of times, selecting as the first value and the second value respective remainders generated as a result of the repeating (f) the respective predetermined numbers of times;
and
storing, at least in part, the residue in memory.

8. The method of claim 7, wherein:
the first value and second value are equal to respective modular divisions of respective data stream portions by the CRC generator polynomial; and
the residue comprises a CRC value corresponding to the packet.

9. The method of claim 8, wherein:
the Barrett reduction is also based at least in part upon the polynomial and another residue.

10. The method of claim 9, wherein:
a fifth value constructed based at least in part upon the one or more respective quotients generated as a result of the repeating of (f) is selected as the another residue.

11. The method of claim 7, wherein:
the at least one iteration comprises a plurality of iterations; and
in the at least one iteration, the at least one other portion of the data stream comprises a previous reduction generated as a result of a previous iteration comprised in the plurality of iterations.

12. The method of claim 7, wherein:
the circuitry is comprised in a network node; and
the packet is one of received by and to be transmitted from the network node.

13. Computer-readable memory storing one or more instructions that when executed by a machine result in execution of operations to produce a residue, the operations comprising:
executing at least one iteration of at least one reduction operation including (a) multiplying a first value with at least one portion of a data stream, the data stream being generated based at least in part upon a packet, and (b) producing a reduction by adding at least one other portion of the data stream to a result of the multiplying;
executing at least one other reduction operation including (c) producing another result by multiplying with a second value at least one portion of another stream based at least in part upon the reduction, (d) producing a third value by adding at least one other portion of the another stream to the another result, and (e) producing the residue by performing a Barrett reduction based at least in part upon the third value;
(f) dividing a high order portion of a fourth value by a cyclical check (CRC) generator polynomial to produce a respective quotient and respective remainder;
(g) repeating (f) respective predetermined numbers of times, and after the repeating (f) the respective predetermined numbers of times, selecting as the first value and the second value respective remainders generated as a result of the repeating (f) the respective predetermined numbers of times.

14. The memory of claim 13, wherein:
the first value and second value are equal to respective modular divisions of respective data stream segments by the CRC generator polynomial; and
the residue comprises a CRC value corresponding to the packet.

15. The memory of claim 14, wherein:
the Barrett reduction is also based at least in part upon the polynomial and another residue.

16. The memory of claim 15, wherein the operations also comprise:
a fifth value constructed based at least in part upon the one or more respective quotients generated as a result of the repeating of (f) is selected as the another residue.

17. The memory of claim 13, wherein:
the at least one iteration comprises a plurality of iterations; and
in the at least one iteration, the at least one other portion of the data stream comprises a previous reduction generated as a result of a previous iteration comprised in the plurality of iterations.

* * * * *

UNITED STATES PATENT AND TRADEMARK OFFICE
CERTIFICATE OF CORRECTION

| | | |
|---|---|---|
| PATENT NO. | : 8,312,363 B2 | Page 1 of 1 |
| APPLICATION NO. | : 12/336029 | |
| DATED | : November 13, 2012 | |
| INVENTOR(S) | : Vinodh Gopal et al. | |

It is certified that error appears in the above-identified patent and that said Letters Patent is hereby corrected as shown below:

On the first page, in field (56), in column 1, under "Other Publications", line 2, delete "I EEE" and insert -- IEEE --, therefor.

In column 8, line 39, in claim 1, delete "cyclical check" and insert -- cyclical redundancy check --, therefor.

In column 9, line 24, in claim 7, delete "cyclical check" and insert -- cyclical redundancy check --, therefor.

In column 10, line 23, in claim 13, delete "cyclical check" and insert -- cyclical redundancy check --, therefor.

Signed and Sealed this
Fifteenth Day of January, 2013

David J. Kappos
*Director of the United States Patent and Trademark Office*